US012696465B2

(12) United States Patent
Tang et al.

(10) Patent No.: US 12,696,465 B2
(45) Date of Patent: Jul. 28, 2026

(54) METHOD AND SYSTEMS FOR FORMING DEVICE STRUCTURES INCLUDING HIGH-K DIELECTRIC LAYERS AND RELATED DEVICE STRUCTURES

(71) Applicant: ASM IP Holding B.V., Almere (NL)

(72) Inventors: Fu Tang, Gilbert, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 380 days.

(21) Appl. No.: 18/238,586

(22) Filed: Aug. 28, 2023

(65) Prior Publication Data

US 2024/0072104 A1      Feb. 29, 2024

Related U.S. Application Data

(60) Provisional application No. 63/402,837, filed on Aug. 31, 2022.

(51) Int. Cl.
| | |
|---|---|
| *C23C 16/455* | (2006.01) |
| *C23C 16/40* | (2006.01) |
| *C23C 16/56* | (2006.01) |
| *H10D 1/68* | (2025.01) |
| *H10P 14/692* | (2026.01) |
| *H10P 50/28* | (2026.01) |

(52) U.S. Cl.
CPC ............. *H10D 1/68* (2025.01); *C23C 16/405* (2013.01); *C23C 16/45527* (2013.01); *C23C 16/56* (2013.01); *H10P 14/69392* (2026.01); *H10P 14/69395* (2026.01); *H10P 14/69397* (2026.01); *H10P 50/283* (2026.01)

(58) Field of Classification Search
CPC ............................ H01L 21/02181; H10D 1/68
See application file for complete search history.

(56) References Cited

U.S. PATENT DOCUMENTS

| | | | |
|---|---|---|---|
| 10,204,788 B1 * | 2/2019 | Ye ........................... | C23C 16/405 |
| 2014/0103472 A1 * | 4/2014 | Kent ...................... | H10N 15/00 |
| | | | 257/421 |
| 2017/0162570 A1 * | 6/2017 | Shih ........................ | H10D 84/84 |
| 2018/0366330 A1 * | 12/2018 | Hegde .................. | H10D 64/021 |
| 2021/0243902 A1 * | 8/2021 | Nakabayashi ......... | H05K 3/422 |
| 2023/0080212 A1 * | 3/2023 | Connor .................. | H10D 99/00 |
| | | | 257/42 |

OTHER PUBLICATIONS

Hedge et al., Hafnium zirconate gate dielectric for advanced gate stack applications, 2007, Journal of Applied Physics, https://pubs.aip.org/aip/jap/article/101/7/074113/918748 (Year: 2007).*

* cited by examiner

*Primary Examiner* — Jeff W Natalini
*Assistant Examiner* — Jacob Raul Marin
(74) *Attorney, Agent, or Firm* — Snell & Wilmer L.L.P.

(57) ABSTRACT

Methods for forming a device structure including a high-k dielectric layer are disclosed. An exemplary method includes using a first cyclical deposition process to deposit a dielectric layer on a substrate and using a second cyclical deposition process to deposit a capping layer directly on the dielectric layer. The methods also include thermally annealing the dielectric layer with the capping layer directly thereon to form a high-k dielectric layer. Exemplary device structures are disclosure, such as metal-insulator-metal capacitor structures.

12 Claims, 5 Drawing Sheets

100

110 PROVIDE A SUBSTRATE INTO A REACTION CHAMBER

120 DEPOSIT A DIELECTRIC LAYER

130 DEPOSIT A CAPPING LAYER DIRECTLY ON THE DIELECTRIC LAYER

140 THERMALLY ANNEAL THE DIELECTRIC LAYER

150 SELECTIVELY REMOVE THE CAPPING LAYER

160 DEPOSIT A METALLIC LAYER DIRECTLY ON THE HIGH-K DIELCTRIC LAYER

160 EXIT

METHOD AND SYSTEMS FOR FORMING DEVICE STRUCTURES INCLUDING HIGH-K DIELECTRIC LAYERS AND RELATED DEVICE STRUCTURES

CROSS-REFERENCE TO RELATED APPLICATIONS

This application is a nonprovisional of, and claims priority to and the benefit of, U.S. Provisional Patent Application No. 63/402,837, filed Aug. 31, 2022 and entitled "METHOD AND SYSTEMS FOR FORMING DEVICE STRUCTURES INCLUDING HIGH-K DIELECTRIC LAYERS AND RELATED DEVICE STRUCTURES," which is hereby incorporated by reference herein.

FIELD OF INVENTION

The present disclosure generally relates to the field of semiconductor processing methods and systems, and to the field of device and integrated circuit manufacture. In particular, the present disclosure generally relates to methods and systems for forming device structures including high-k dielectric layers and related device structures including high-k dielectric layers.

BACKGROUND OF THE DISCLOSURE

The scaling of semiconductor devices, such as, for example, logic and memory devices, has led to significant improvements in speed and density of integrated circuits. However, conventional device scaling techniques face significant challenges for future technology nodes.

For example, present and future process nodes may call for capacitor structures with an increased electrical charge storage capability. In addition, some devices and integrated circuits, may require a down scaling of capacitor structure dimensions without a reduction in the capacitors electrical charge storage capability. Both of the above device requirements can be addressed by the development of high quality thin film high-k dielectrics. Therefore, methods and apparatus for forming such high quality thin film high-k dielectrics are desirable.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods for forming device structure, the methods including the steps of: providing a substrate within a reaction chamber, depositing a hafnium zirconium oxide layer on the substrate by performing one or more deposition super-cycles of a first cyclical deposition process, and depositing a capping layer directly on the hafnium zirconium oxide layer by performing one or more deposition super-cycles of a second cyclical deposition process. The methods of the present disclosure can also include the steps of: thermally annealing the hafnium zirconium oxide layer with the capping layer directly thereon, crystallizing at least a portion of the hafnium zirconium oxide layer thereby forming a hafnium zirconium oxide high-k dielectric layer; selectively removing the capping layer, and depositing a metallic layer on the hafnium zirconium oxide high-k dielectric layer.

The embodiments of the present disclosure also relate to methods for forming a device structure including a high-k dielectric layer, the methods can include the steps of, providing a substrate comprising a metallic surface within a reaction chamber, depositing a dielectric layer directly on the metallic surface, and depositing a capping layer directly on the dielectric layer. The methods of the present disclosure can also include the steps of thermally annealing the dielectric layer with the capping layer thereon thereby forming a high-k dielectric layer, selectively removing the capping layer, and depositing a metallic layer directly on the high-k dielectric layer.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
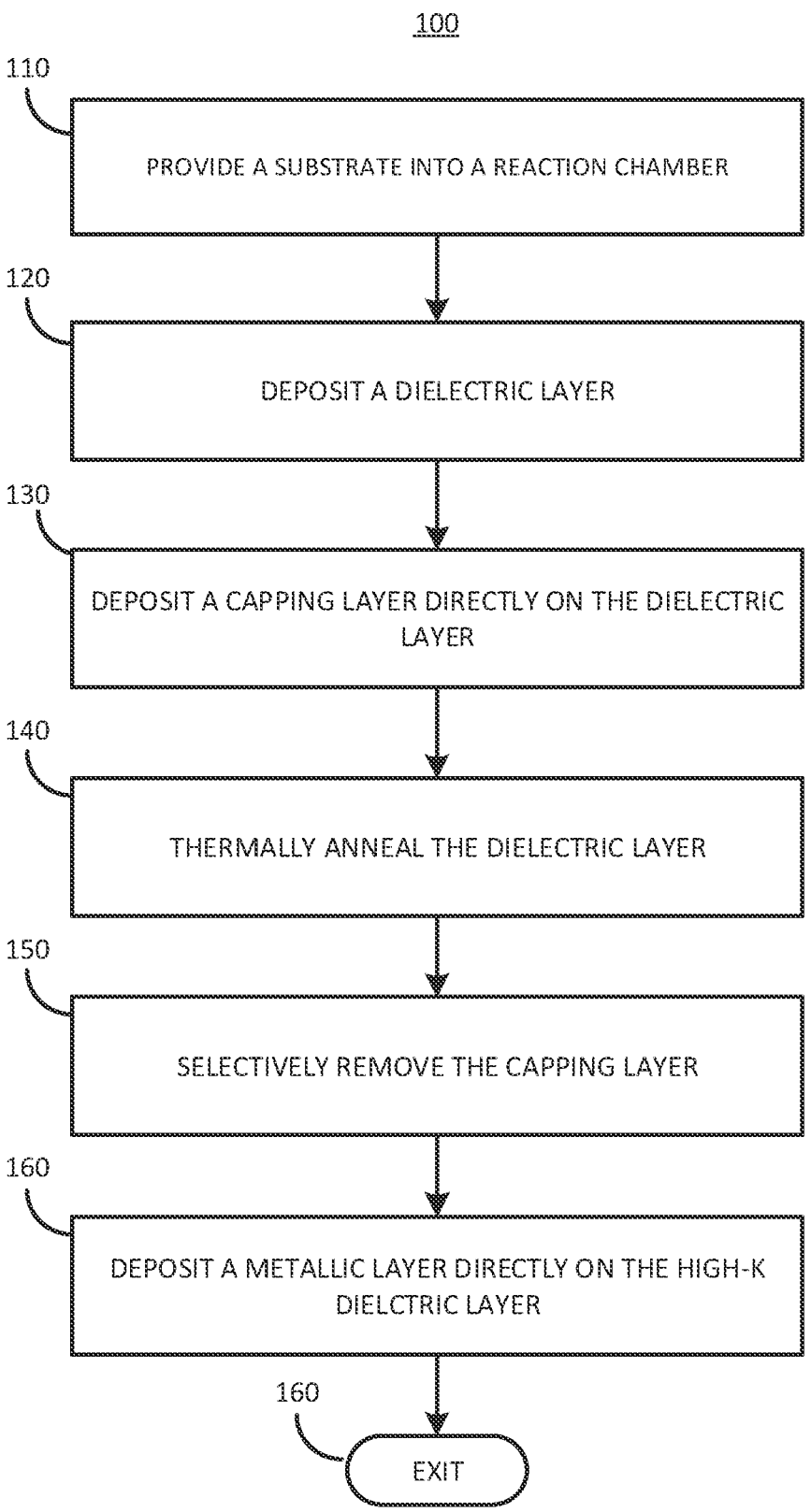
FIG. 1 illustrate an exemplary method in accordance with the embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices, and apparatus provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gasses, depending on the context. A gas other than the process gas, i.e., a gas introduced without passing through a gas distribution assembly, other gas distribution device, or the like, can be used for, e.g., sealing the reaction space, and can include a seal gas. Precursors and reactants can be gasses. Exemplary seal gasses include noble gasses, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material. Further, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e. ceramic fibers or polymer fibers). Continuous substrates may also comprise carriers or sheets upon which non-continuous substrates are mounted.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate and/or may be or may become embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices. A film or layer may be selectively grown on some parts of a substrate, and not on others.

The term "deposition process" as used herein can refer to the introduction of precursors (and/or reactants) into a reaction chamber to deposit a layer over a substrate. "Cyclical deposition processes" are examples of "deposition processes".

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es). A pulse can comprise exposing a substrate to a precursor or reactant. This can be done, for example, by introducing a precursor or reactant to a reaction chamber in which the substrate is present. Additionally or alternatively, exposing the substrate to a precursor can comprise moving the substrate to a location in a substrate processing system in which the reactant or precursor is present.

Generally, for ALD processes, during each cycle, a precursor is introduced into a reaction chamber and is chemisorbed onto a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, a "precursor" includes a gas or a material that can become gaseous and that can be represented by a chemical formula that includes an element which may be incorporated during a deposition process as described herein.

As used herein, a "structure" can be or include a substrate as described herein. Structures can include one or more layers overlying or within the substrate, such as one or more layers formed according to a method as described herein. Full devices or partial device portions can be included within or on structures.

As used herein, the term "high-k dielectric" may refer to a dielectric layer demonstrating a dielectric constant greater than about 7.

As used herein, the term "crystalline state" may refer to a layer which displays at least short range ordering or even long range ordering of the crystalline structure and includes single crystalline films as well as polycrystalline films.

As used herein, the term "amorphous state" may refer to a layer which displays substantially no ordering of the crystalline structure as would be observed in a crystalline layer.

As used herein, the term "hafnium zirconium oxide" is a material that can be represented by a chemical formula that includes at least hafnium, zirconium, and oxygen. In some embodiments, hafnium zirconium oxide may not include significant proportions of elements other than hafnium, zirconium, and oxygen. In some embodiments, the hafnium zirconium oxide may consist essentially of hafnium zirconium oxide. In some embodiments, the hafnium zirconium oxide may consist of hafnium zirconium oxide. A layer consisting of hafnium zirconium oxide may include an acceptable amount of impurities, such as hydrogen, carbon, chlorine, and/or the like that may originate from one or more precursors used to deposit said materials.

As used herein, the term "hafnium lutetium oxide" is a material that can be represented by a chemical formula that includes at least hafnium, lutetium, and oxygen. In some embodiments, hafnium lutetium oxide may not include significant proportions of elements other than hafnium, lutetium, and oxygen. In some embodiments, the hafnium lutetium oxide may consist essentially of hafnium lutetium oxide. In some embodiments, the hafnium lutetium oxide may consist of hafnium lutetium oxide. A layer consisting of hafnium lutetium oxide may include an acceptable amount of impurities, such as hydrogen, carbon, chlorine, and/or the like that may originate from one or more precursors used to deposit said materials.

As used herein, the term "laminate film" may refer to a film comprising two or more films with different composition alternatingly deposited on a substrate. In some embodiments, the laminate film may comprise separate and distinct films that are discernable by high magnification microscopy imaging techniques. In alternative embodiments, the laminate film may not comprise separate and distinct layers that are discernable by high magnification microscopy imaging techniques.

A number of example materials are given throughout the embodiments of the current disclosure, it should be noted that the chemical formulas given for each of the example materials should not be construed as limiting and that the non-limiting example materials given should not be limited by a given example stoichiometry.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

In the specification, it will be understood that the term "on" or "over" may be used to describe a relative location relationship. Another element, film or layer may be directly on the mentioned layer, or another layer (an intermediate layer) or element may be intervened therebetween, or a layer may be disposed on a mentioned layer but not completely cover a surface of the mentioned layer. Therefore, unless the term "directly" is separately used, the term "on" or "over" will be construed to be a relative concept. Similarly to this, it will be understood the term "under", "underlying", or "below" will be construed to be relative concepts.

The present disclosure may include methods and systems for forming device structures including a high-k dielectric layer. For example, a high-k dielectric layer can be employed within a capacitor structure in semiconductor devices and integrated circuits, including but not limited to, memory devices (e.g., DRAM) and logic devices (e.g., in BEOL processes and structures).

In more detail, there are a number of technical challenges involved in forming high-k dielectric layers. One particularly challenge for the formation of high-k dielectric layers involves forming extremely thin dielectric layers that maintain a high-k characteristic. As a non-limiting example, some application for high-k dielectric films can require a dielectric constant greater than 7 at a film thickness of less than 4 nanometers (nm). The embodiments of the current disclosure are desirable as the methods, systems and associated device structures may comprise superior quality high-k dielectric films with low average film thickness.

In some embodiments of the disclosure, a dielectric layer can be formed by a deposition process and said dielectric layer can subsequently be subjected to a thermal annealing process to crystallize at least a portion of the dielectric film thereby forming a high-k dielectric film. In some embodiments, the dielectric layer can be capped with an addition layer (a capping layer) prior to the thermal annealing. The capping layer can be introduced to improve the quality and dielectric constant of the high-k dielectric layer resulting from the thermal treat of the as-deposited dielectric layer.

Therefore, the present disclosure may include methods for forming a device structure and particularly methods for forming a device structure including a high-k dielectric. As a non-limiting example, the device structure and associated high-k dielectric layers of the present disclosure may be employed in capacitor structures, such as, but not limited to, metal-insulator-metal capacitor structures. In some embodiments, the methods can comprise, providing a substrate within a reaction chamber, depositing a dielectric layer on the substrate, and subsequently depositing a capping layer directly on the dielectric layer. The methods of the disclosure can also include, thermally annealing the dielectric layer with the capping layer on thereby forming a high-k dielectric layer. In additional methods of the disclosure, the capping layer may be subsequently selectively removed to expose the underlying high-k dielectric layer and a metallic layer can be deposited on the exposed high-k dielectric layer.

FIG. 1 illustrates an exemplary method 100 that can be used to form a device structure including a high-k dielectric layer, such as, for example, a capacitor structure, as well as intermediate device structures.

In brief, method 100 may include the steps of providing a substrate within a reaction chamber (step 110), and depositing a dielectric layer on the substrate (120). The substrate can include a metallic surface and the dielectric layer can be deposited directly on said metallic surface. Exemplary method 100 can also include, depositing a capping layer (130) directly on the dielectric layer and thermally annealing the dielectric layer with the capping layer thereon to form a high-k dielectric layer (140). The capping layer can then be selectively removed (150) to expose the high-k dielectric layer and subsequently a metallic layer can be deposited on the high-k dielectric layer (160).

In more detail, exemplary method 100 can include step 110 comprising, providing a substrate within a reaction chamber. The reaction chamber employed for step 110 can be, or include, a reaction chamber of a chemical vapor deposition reactor system configured to perform cyclical chemical vapor deposition process. In some embodiment, the reaction chamber employed for step 110 can be, or include, a reaction chamber of an atomic layer deposition reactor system configured to perform one or more cyclical deposition processes. The reaction chamber can be a stand-alone reaction chamber or part of a cluster tool. The reaction chamber may be a batch processing tool. In some embodiments, a flow-type reactor may be utilized. In some embodiments, a showerhead-type reactor may be utilized. In some embodiments, a space divided reactor may be utilized. In some embodiments, a high-volume manufacturing-capable single wafer reactor may be utilized. In other embodiments, a batch reactor comprising multiple substrates may be utilized. For embodiments in which a batch reactor is used, the number of substrates may be in the range of 10 to 200, or 50 to 150, or even 100 to 130. The reactor can be configured as a thermal reactor—with no plasma excitation apparatus. Alternatively, the reactor can include direct and/or remote plasma apparatus.

In some embodiments of the disclosure, the substrate disposed within the reaction chamber may include a metallic surface and the exemplary method 100 (FIG. 1) can be employed to form a high-k dielectric layer on said metallic surface. Upon formation of a high-k dielectric layer, a metallic layer can be formed, e.g., by deposition, on the high-k dielectric layer, thereby forming a metal-insulator-metal capacitor structure. In some embodiment, the metallic surface and the metallic layer deposited on the high-k dielectric layer may comprise titanium nitride (TiN), or a noble metal, for example.

The exemplary method 100 may further comprise, depositing a dielectric layer on the substrate (120) and in particular embodiments, the substrate may include a metallic surface and the dielectric layer can be deposited directly on said metallic surface.

In more detail, the dielectric layer may comprise a metal oxide layer, and in particular embodiments the metal oxide layer may comprise a hafnium oxide layer, for example. In some embodiments of the disclosure, the hafnium oxide layer may comprise a hafnium zirconium oxide layer (HfZrO) comprising at least hafnium, zirconium, and oxygen.

In some embodiments, the dielectric film can comprise a hafnium zirconium oxide layer formed by depositing alternating layers of hafnium oxide and zirconium oxide. In such embodiments, the dielectric film can comprise a hafnium zirconium oxide laminate structure comprising repeated hafnium oxide/zirconium oxide bilayers.

In some embodiment, the exemplary method 100 may comprising depositing the dielectric layer (e.g., a hafnium zirconium oxide) on the substrate by performing one of more deposition super-cycles of a first cyclical deposition process.

In more detail, a dielectric film may be deposited by performing one or more deposition super-cycles of a first cyclical deposition process. Details regarding methods for depositing metal oxide laminate films by cyclical deposition process are described in U.S. Pat. No. 9,023,427, filed May 16, 2012 (hereinafter "427 application"), the entire disclosure of which is incorporated herein by reference for all purposes, and therefore such processes are only described briefly herein. For example, the dielectric film may comprise a hafnium zirconium oxide laminate deposited by repeating one of more deposition super-cycles of a first cyclical deposition process, wherein a unit deposition super-cycle comprises: depositing a hafnium oxide film by contacting the substrate with sequential and alternating pulses of a hafnium precursor and a first oxygen reactant; and depositing a zirconium oxide film by contacting the substrate with sequential and alternating pulses of an zirconium precursor and a second oxygen reactant.

In some embodiment of the disclosure, the exemplary method 100 (FIG. 1) may comprise depositing a dielectric layer (120) in a substantially amorphous state, i.e., wherein the majority of the deposited dielectric layer does not display any long range ordering of its structure as would be found in a crystalline layer. For example, a first cyclical deposition process may be employed to deposit a dielectric layer comprising a hafnium zirconium oxide layer which may be in amorphous state as-deposited.

In some embodiment of the disclosure, the dielectric layer may be deposited to an average layer thickness of greater zero and less 10 nanometers (nm), or less than 8 nm, or less than 6 nm, or less than 4 nm, or even less than 2 nm. In some embodiments, the dielectric layer may be deposited at an average layer thickness of greater than zero and less than 4 nm.

In some embodiment, the deposited dielectric layer may comprise a hafnium zirconium oxide laminate structure with separate and distinct metal oxide layers (e.g., composed of hafnium and zirconium oxides) which are discernable post deposition. For example the deposited hafnium zirconium oxide laminate structure may be examined utilizing high resolution imaging techniques, such as, for example, transmission electron microscopy (TEM), or scanning tunneling electron microscopy (STEM), and the individual layers comprising the laminate may be imaged.

In some embodiments, the dielectric layer may comprise a hafnium zirconium oxide deposited as a laminate structure as previously described but the deposition processes, or post deposition processes, may result in the intermixing of the hafnium oxide/zirconium oxide bilayers thereby forming a hafnium zirconium oxide layer comprising a mixed metal oxide. For example, in a mixed metal oxide separate and distinct layer may not be discernable as a result of intermixing between the repeating metal oxide layers. For example, a uniform or substantially compositionally uniform hafnium zirconium oxide film may be deposited by the methods disclosed herein.

The exemplary method 100 (FIG. 1) may continue and further comprise, depositing a capping layer on the dielectric layer (130). In particular embodiments of the disclosure, the capping layer may be deposited directly on the dielectric layer. For example, a capping layer may be employed in the methods of the current disclosure to not only promote subsequent crystallization of the underlying dielectric layer but in addition promote the crystallization of the dielectric layer into a high-k dielectric film with a preferred crystalline structure, the preferred crystalline structure resulting in a high value for the dielectric constant of the resulting high-k dielectric film. In some embodiment, a preferred crystalline structure for the high-k dielectric film comprises at least one of cubic, orthorhombic, monoclinic, tetragonal, or mixtures thereof.

In more detail, the capping layer may comprise a metal layer or a metal oxide layer. In some embodiment, depositing the capping layer (130) may further comprise depositing at least one of a lutetium oxide, a hafnium oxide, a magnesium oxide, a zirconium oxide, a niobium oxide, an indium oxide, and mixed oxides and metal oxide laminates thereof. In some embodiments, the capping layer may comprise a hafnium lutetium oxide layer comprising at least hafnium, lutetium, and oxygen.

In some embodiments, the capping layer can comprise a hafnium lutetium oxide layer formed by depositing alternating layers of hafnium oxide and lutetium oxide. In such embodiments, the capping layer can comprise a hafnium lutetium oxide laminate structure comprising repeated hafnium oxide/lutetium oxide bilayers.

In some embodiment, the exemplary method 100 may comprising depositing the capping layer (e.g., a hafnium lutetium oxide) on the substrate by performing one of more deposition super-cycles of a second cyclical deposition process.

In more detail, a capping layer may be deposited by performing one or more deposition super-cycles of a second cyclical deposition process. Details regarding methods for depositing metal oxide laminate films by cyclical deposition process are described in the 427 application as previously disclosed, and therefore such processes are only described briefly herein. For example, the capping layer may comprise a hafnium lutetium oxide laminate deposited by repeating one of more deposition super-cycles of a second cyclical deposition process, wherein a unit deposition super-cycle comprises: depositing a hafnium oxide film by contacting the substrate with sequential and alternating pulses of a hafnium precursor and a third oxygen reactant; and depositing a lutetium oxide film by contacting the substrate with sequential and alternating pulses of an lutetium precursor and a second oxygen reactant.

In some embodiment of the disclosure, the exemplary method 100 (FIG. 1) may comprise depositing a capping layer (130) in a substantially amorphous state, i.e., wherein the majority of the deposited capping layer does not display any long range ordering of its structure as would be found in a crystalline layer. For example, a second cyclical deposition process may be employed to deposit a capping layer comprising a hafnium lutetium oxide layer which may be in amorphous state as-deposited.

In some embodiment of the disclosure, the capping layer may be deposited to an average layer thickness of greater zero and less 12 nm, or less than 10 nm, or less than 8 nm, or less than 6 nm, or less than 4 nm, or even less than 2 nm. In some embodiments, the capping layer may be deposited at an average layer thickness of greater than zero and less than 8 nm.

In some embodiment, the deposited hafnium lutetium oxide laminate structure may have separate and distinct metal oxide layers (e.g., composed of hafnium and zirconium oxides) which are discernable post deposition. For example the deposited hafnium lutetium oxide laminate structure may be examined utilizing high resolution imaging techniques, such as, for example, transmission electron microscopy (TEM), or scanning tunneling electron microscopy (STEM), and the individual layers comprising the laminate may be imaged.

In some embodiments, the hafnium lutetium oxide may be deposited as a laminate structure as previously described but the deposition processes, or post deposition processes, may result in the intermixing of the hafnium oxide/lutetium oxide bilayers thereby forming a hafnium lutetium oxide layer comprising a mixed metal oxide. For example, in a mixed metal oxide separate and distinct layer may not be discernable as a result of intermixing between the repeating metal oxide layers. For example, a uniform or substantially compositionally uniform hafnium lutetium oxide film may be deposited by the methods disclosed herein.

The exemplary method 100 (FIG. 1) may continue and further comprise, thermally annealing the dielectric layer (140). For example, the dielectric layer with the capping layer thereon may be thermally annealed, i.e., heated within a controlled environment, to promote crystallization of at least a portion of the dielectric layer thereby transforming the as-deposited dielectric layer into a high-k dielectric layer.

In more detail, the exemplary method 100 may comprise thermally annealing the dielectric layer (140) with the capping layer thereon, and crystallizing at least a portion of the dielectric layer thereby forming a high-k dielectric layer. In some embodiments, the step 140 may comprise, thermally annealing a hafnium zirconium oxide layer with a hafnium lutetium oxide capping layer directly thereon, and crystallizing at a portion of the hafnium zirconium oxide layer thereby forming a hafnium zirconium oxide high-k dielectric film.

In some embodiment of the disclosure, thermally annealing the dielectric layer (140) may further comprise, heating the dielectric layer to a temperature between 300° C. and 1200° C., or between 400° C. and 1000° C., or between 600° C. and 800° C. In some embodiment of the disclosure, thermally annealing the dielectric layer (140) may further comprise, heating the dielectric layer to a temperature less 1200° C., or less than 1000° C., or less than 800° C., or less than 600° C., or less than 400° C., or less than 200° C., or even less than 100° C.

In some embodiments, the dielectric layer may comprise a portion of a partially fabricated device structure and/or integrated circuit structure which may have thermal budget restrictions due to existing device layers and/or subsequent device layers to be formed over the dielectric layer. In such embodiments, thermally annealing the dielectric layer (140) may comprise heating the dielectric layer to a temperature of less than 400° C., or less than 200° C., or even less than 100° C.

In some embodiment of the disclosure, the dielectric layer may comprise a hafnium zirconium oxide layer and thermally annealing the hafnium zirconium oxide layer may comprise, heating the hafnium zirconium oxide layer to a temperature between 300° C. and 1200° C., or between 400° C. and 1000° C., or between 600° C. and 800° C. In some embodiment of the disclosure, thermally annealing the hafnium zirconium layer (140) may further comprise, heating the hafnium zirconium oxide layer to a temperature less of 1200° C., or less than 1000° C., or less than 800° C., or less than 600° C., or less than 400° C., or less than 200° C., or even less than 100° C. In some embodiment, the thermal annealing process may be performed in a reaction chamber at or near atmospheric pressure. In some embodiment, the thermal annealing process may be performed in a reaction chamber under an inert gas atmosphere, such as, argon or nitrogen, for example.

In some embodiments, thermally annealing the dielectric layer further comprises, crystallizing at least a portion of the dielectric layer. In some embodiments, thermally annealing the dielectric layer with the capping layer directly layer further comprises, crystallizing at least a portion of the capping layer. In some embodiments, the dielectric layer comprises a hafnium zirconium oxide layer and thermally annealing the hafnium zirconium oxide layer further comprises, crystallizing at least a portion of the hafnium zirconium oxide layer. In some embodiments, the capping layer comprises a hafnium lutetium oxide layer and thermally annealing the underlying hafnium zirconium oxide layer further comprises, crystallizing at least a portion of the hafnium lutetium oxide layer.

In some embodiments, thermally annealing the dielectric layer with the capping layer directly thereon, does not result in any substantial interdiffusion between the dielectric layer and the capping layer. For example, thermally annealing a hafnium zirconium oxide dielectric layer with a hafnium lutetium oxide capping layer directly thereon does not result in any substantial diffusion of zirconium into the hafnium lutetium oxide capping layer and likewise does not result in any substantial diffusion of lutetium into the resulting hafnium zirconium oxide high-k dielectric layer.

In some embodiments, thermally annealing the dielectric layer with the capping layer directly thereon, does not result in any substantial addition of stress/strain in the resulting high-k dielectric layer when compared with the pre-anneal stress/strain state of the dielectric film. For example, depositing a hafnium lutetium oxide capping layer directly on a hafnium zirconium oxide dielectric, and annealing to promote crystallization, results in a hafnium zirconium oxide high-k layer without any substantial change in stress/strain state in comparison with the pre-annealed stress/strain state of the hafnium zirconium oxide dielectric film.

In some embodiments of the disclosure, the post anneal high-k layer and the capping layer may have the same or a substantially similar crystalline structure. For example, a hafnium zirconium oxide high-k layer and a hafnium lutetium oxide capping layer may have the same or a substantially similar crystalline structure having undergone the thermal annealing processes as described herein. In some embodiments, both the high-k layer and the capping layer post anneal may have a crystalline structure comprising at least one of cubic, orthorhombic, monoclinic, tetragonal, or mixtures thereof.

In some embodiments of the disclosure, thermally annealing the dielectric layer with the capping layer directly thereon results in the formation of a high-k dielectric film with a dielectric constant greater than 7, or greater than 10, or greater than 20, or greater than 30, or greater than 40, or even greater than 50, with an associated high-k dielectric average film thickness of less than 10 nm, or less than 8 nm, or less than 6 nm, or less than 4 nm, or even less than 2 nm.

In some embodiments of the disclosure, the high-k dielectric film may have a dielectric constant greater than 30 at an average film thickness of less than 4 nm. In some embodiments the high-k dielectric film may have a dielectric constant greater than 40 at an average film thickness of less than 4 nm. In some embodiments the high-k dielectric film may have a dielectric constant greater than 50 at an average film thickness of less than 4 nm.

The exemplary method 100 (FIG. 1) may continue and further comprise, selectively removing the capping layer (150). As described above, the capping layer can be employed to promote crystallization of the underlying dielectric layer during thermal annealing in addition to the subsequent formation of a superior quality high-k dielectric film with a higher dielectric constant. Once the thermal annealing process has been completed the capping layer can be removed to expose the high-k dielectric film which can subsequently be incorporated into device structures, such as, for example, capacitor structures.

In some embodiments, selectively removing the capping layer may further comprise, selectively etching the capping layer employing at least one of a hydrofluoric (HF) acid based etchant, an ammonia ($NH_3$) based etchant, or a hydrochloric (HCl) and hydrogen peroxide ($H_2O_2$) based etchant.

The exemplary method 100 (FIG. 1) may continue and further comprise, depositing a metallic layer on the high-k dielectric layer (160). For example, the substrate upon which the high-k dielectric layer is formed may include a metallic surface and therefore forming a subsequent metallic layer on the high-k dielectric film formed by the methods of the present disclosure, results in the formation of a metal-insulator-metal capacitor structure. For example, the subsequent metallic layer may comprise titanium nitride or a noble metal deposited to an average film thickness between 2 nm and 50 nm.

The exemplary method 100 (FIG. 1) may exit (160) upon completion of the forming of a capacitor structure. In some embodiments, method 100 (FIG. 1) may include additional steps. As non-limiting examples, method 100 may include additional steps prior to the cyclical deposition of both the dielectric layer and the capping layer and/or additional steps subsequent to the depositing a metallic layer on the high-k dielectric film.

Figure 2:
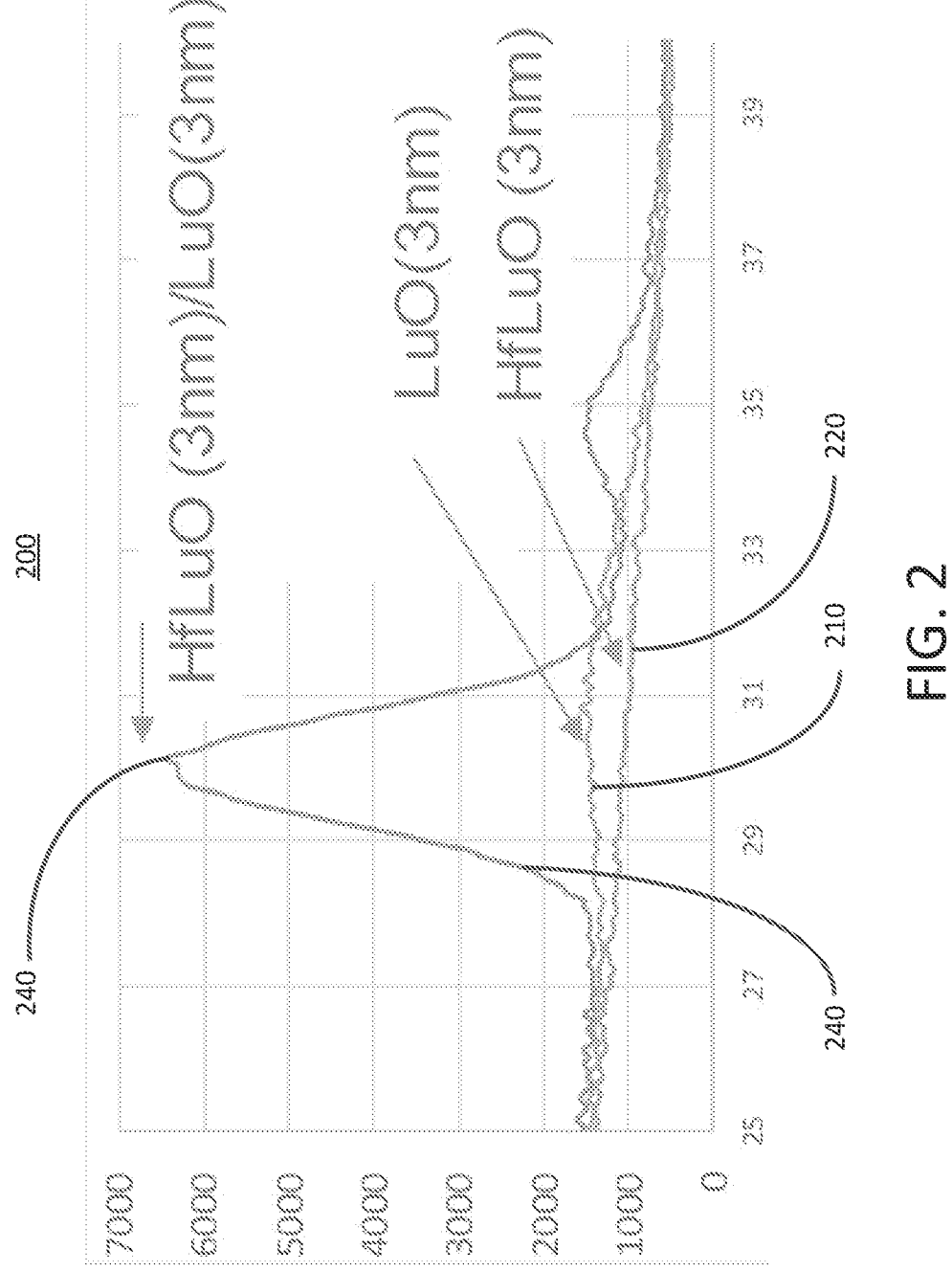
FIG. 2 illustrates exemplary x-ray diffraction (XRD) data from films deposited according to the methods of the disclosure.

FIG. 2 illustrates exemplary x-ray diffraction (XRD) data 200 measured from films deposited and annealed according to the embodiments the disclosure. Examination of XRD data 200 demonstrates that XRD data from a lutetium oxide film 210 and a hafnium lutetium oxide film 220 show no discernable peaks and hence are in a predominantly amorphous state even after a thermal annealing process. However, the XRD data from a hafnium lutetium oxide laminate film 230 shows a clear discernable peak 240 and hence the hafnium lutetium oxide laminate film is in a predominantly crystalline state post anneal and suitable to be employed as a capping layer of the present disclosure.

Figure 3:
FIG. 3 illustrates an exemplary device structure in accordance with embodiments of the disclosure and FIG. 4 illustrates an additional exemplary device structure in accordance with embodiments of the disclosure.
Figure 3:
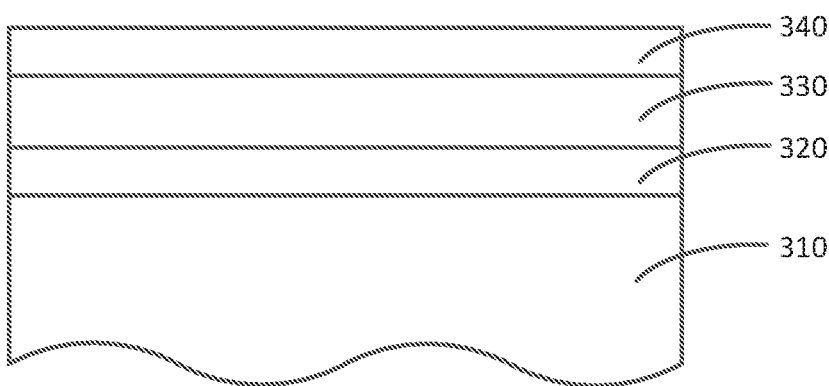

FIG. 3 illustrates a structure 300 in accordance with additional embodiments of the disclosure. In more detail, the structure 300 may comprise a device structured formed by exemplary method 100 (FIG. 1) of the present disclosure, and in particular the structure 300 may comprise a partially fabricated device structured formed by the process steps 110, 120, and up to, and including step 130. For example, the structure 300 of FIG. 3 may comprise, a substrate 310, a metallic layer 320, a dielectric film 330, and a capping layer 330.

Figure 4:
Figure 4:
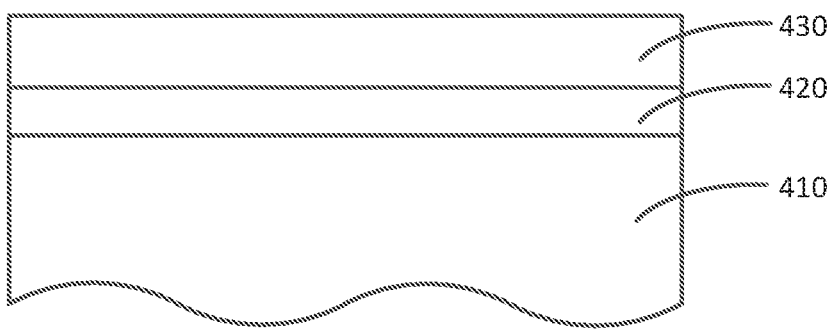

FIG. 4 illustrates a structure 400 in accordance with additional embodiments of the disclosure. In more detail, the structure 400 may comprise a device structured formed by exemplary method 100 (FIG. 1) of the present disclosure, and in particular the structure 400 may comprise a partially fabricated device structured formed by the process steps 110, 120, 130, 140, and up to and including step 150. For example, the structure 400 of FIG. 4 may comprise, a substrate 410, a metallic layer 420, and an exposed high-k dielectric film 430.

Figure 5:
FIG. 5 illustrates a further exemplary device structure in accordance with embodiments of the disclosure.
Figure 5:
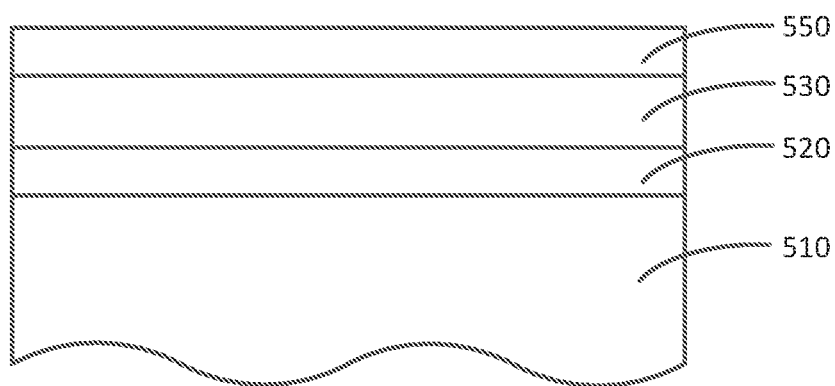

FIG. 5 illustrates a structure 500 in accordance with additional embodiments of the disclosure. In more detail, the structure 500 may comprise a device structured formed by exemplary method 100 (FIG. 1) of the present disclosure, and in particular the structure 500 may comprise a partially fabricated device structured formed by the process steps 110, 120, 130, 140, 150, and up to and including step 160. For example, the structure 500 of FIG. 5 may comprise, a substrate 510, a metallic layer 520, a high-k dielectric film 530, and metallic layer 550 disposed on the high-k dielectric film.

Embodiments of the disclosure may further comprise semiconductor structures formed according to the methods as described here.

Embodiments of the disclosure may further comprise systems and apparatus configured for performing the methods as described herein.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a device structure, the method comprising the steps of:

provide a substrate within a reaction chamber;

depositing a hafnium zirconium oxide layer on the substrate by performing one or more deposition super-cycles of a first cyclical deposition process;

depositing a capping layer directly on the hafnium zirconium oxide layer by performing one or more deposition super-cycles of a second cyclical deposition process;

thermally annealing the hafnium zirconium oxide layer with the capping layer directly thereon;

crystallizing at least a portion of the hafnium zirconium oxide layer thereby forming a hafnium zirconium oxide high-k dielectric layer;

selectively removing the capping layer; and depositing a metallic layer on the hafnium zirconium oxide high-k dielectric layer.

2. The method of claim 1, wherein the hafnium zirconium oxide layer comprises a mixed metal oxide, a metal oxide laminate, or mixtures thereof.

3. The method of claim 2, wherein depositing the hafnium zirconium oxide layer further comprises depositing a haf-nium zirconium oxide layer in an amorphous state with an average layer thickness of greater than zero and less than 4 nanometers (nm).

4. The method of claim 1, wherein the capping layer comprises a metal, or a metal oxide, and depositing the capping layer further comprises, depositing at least one of a lutetium oxide, a hafnium oxide, a magnesium oxide, a zirconium oxide, a niobium oxide, an indium oxide, and mixed oxides and metal oxide laminates thereof.

5. The method of claim 4, wherein the capping layer comprises a mixed metal oxide or a metal oxide laminate comprising hafnium, lutetium, and oxygen.

6. The method of claim 5, wherein depositing the capping layer further comprises depositing a hafnium lutetium oxide capping layer in an amorphous state with an average layer thickness of greater than zero and less than 8 nanometers (nm).

7. The method of claim 1, wherein thermally annealing the hafnium zirconium oxide layer further comprises, heating the hafnium zirconium oxide layer to a temperature between 300° C. and 1200° C.

8. The method of claim 7, wherein thermally annealing the hafnium zirconium oxide layer does not result in inter-diffusion between the hafnium zirconium oxide layer and the capping layer.

9. The method of claim 7, wherein thermally annealing the hafnium zirconium oxide layer does not result in additional strain/stress in the hafnium zirconium oxide high-k dielectric layer.

10. The method of claim 1, wherein crystallizing at least a portion of the hafnium zirconium oxide layer further comprises, crystallizing at least a portion of the capping layer.

11. The method of claim 10, wherein the hafnium zirconium oxide high-k dielectric layer has a dielectric constant great than 30 with an average layer thickness of less than 4 nanometers (nm).

12. The method of claim 1, wherein selectively removing the capping layer further comprises, selectively etching the capping layer employing a hydrofluoric acid based etchant, an ammonia based etchant, or a hydrochloric acid and hydrogen peroxide based etchant.

* * * * *